(12) United States Patent
Kim et al.

(10) Patent No.: US 10,701,813 B2
(45) Date of Patent: Jun. 30, 2020

(54) ROLLABLE FLEXIBLE DISPLAY DEVICE

(71) Applicant: LG Display Co., Ltd., Seoul (KR)

(72) Inventors: Jeonghun Kim, Goyang-si (KR);
Bongchul Kim, Daegu (KR)

(73) Assignee: LG Display Co., Ltd., Seoul (KR)

( * ) Notice: Subject to any disclaimer, the term of this patent is extended or adjusted under 35 U.S.C. 154(b) by 36 days.

(21) Appl. No.: 15/499,765

(22) Filed: Apr. 27, 2017

(65) Prior Publication Data

US 2017/0318693 A1 Nov. 2, 2017

(30) Foreign Application Priority Data

Apr. 28, 2016 (KR) .................. 10-2016-0052167

(51) Int. Cl.
| | |
|---|---|
| *H05K 5/00* | (2006.01) |
| *G06F 1/16* | (2006.01) |
| *H04N 5/64* | (2006.01) |
| *H02K 11/21* | (2016.01) |
| *H02K 11/33* | (2016.01) |
| *H01L 51/52* | (2006.01) |
| *H02K 7/14* | (2006.01) |
| *H02P 1/16* | (2006.01) |
| *H02P 3/06* | (2006.01) |
| *G09F 9/30* | (2006.01) |

(52) U.S. Cl.
CPC ......... *H05K 5/0017* (2013.01); *G06F 1/1652* (2013.01); *H01L 51/5253* (2013.01); *H02K 7/14* (2013.01); *H02K 11/21* (2016.01); *H02K 11/33* (2016.01); *H02P 1/16* (2013.01); *H02P 3/06* (2013.01); *H04N 5/64* (2013.01); *G09F 9/301* (2013.01); *H01L 2251/5338* (2013.01)

(58) Field of Classification Search
CPC ..................................................... G03B 21/58
USPC ........................................ 359/461; 318/469
See application file for complete search history.

(56) References Cited

U.S. PATENT DOCUMENTS

| | | | |
|---|---|---|---|
| 6,979,962 B2* | 12/2005 | Cavarec ............... | E06B 9/32 318/9 |
| 7,515,338 B2* | 4/2009 | Canon ................ | E06B 9/80 160/310 |
| 9,535,302 B2 | 1/2017 | Lee | |

(Continued)

FOREIGN PATENT DOCUMENTS

| | | |
|---|---|---|
| CN | 2724052 Y | 9/2005 |
| CN | 2927116 Y | 7/2007 |

(Continued)

OTHER PUBLICATIONS

First Office Action, Chinese Patent Application No. 201710291706.1, dated Mar. 5, 2019, 17 pages.

(Continued)

*Primary Examiner* — Christopher E Mahoney
(74) *Attorney, Agent, or Firm* — Fenwick & West LLP

(57) ABSTRACT

The present disclosure provides a rollable display device including a display panel configured to display an image, a panel roller having a mechanical structure that enables rolling up the display panel around an outer circumferential surface of the panel roller, and a roller driving unit configured to control a motor so that the display panel rolls around the outer circumferential surface of the panel roller or unrolls therefrom, wherein the roller driving unit and the motor are disposed in the panel roller.

11 Claims, 18 Drawing Sheets

(56) References Cited

U.S. PATENT DOCUMENTS

| | | | |
|---|---|---|---|
| 9,870,029 B2 | 1/2018 | Kim et al. | |
| 10,186,681 B2 | 1/2019 | Kang et al. | |
| 2002/0028119 A1* | 3/2002 | Elrod | B23Q 37/002 |
| | | | 409/185 |
| 2007/0018170 A1* | 1/2007 | Jeong | G02F 1/13454 |
| | | | 257/72 |
| 2008/0198125 A1* | 8/2008 | Park | G09G 3/3696 |
| | | | 345/98 |
| 2008/0259451 A1* | 10/2008 | Jiang | G03B 21/56 |
| | | | 359/461 |
| 2008/0305848 A1* | 12/2008 | Okada | G07F 17/3213 |
| | | | 463/20 |
| 2009/0308543 A1* | 12/2009 | Kates | E06B 9/44 |
| | | | 160/5 |
| 2012/0062447 A1* | 3/2012 | Tseng | G02F 1/133305 |
| | | | 345/33 |
| 2014/0133019 A1* | 5/2014 | Mullet | E06B 9/62 |
| | | | 359/461 |
| 2014/0217397 A1* | 8/2014 | Kwak | H01L 27/1218 |
| | | | 257/43 |
| 2014/0307378 A1* | 10/2014 | Kang | G06F 1/1652 |
| | | | 361/679.21 |
| 2015/0228706 A1 | 8/2015 | Lee | |
| 2016/0043010 A1* | 2/2016 | Kwak | H01L 22/14 |
| | | | 257/48 |
| 2016/0063910 A1* | 3/2016 | An | G09G 3/3233 |
| | | | 345/691 |
| 2016/0187929 A1 | 6/2016 | Kim et al. | |
| 2016/0205791 A1* | 7/2016 | Kim | G06F 1/1652 |
| | | | 361/679.01 |
| 2017/0031388 A1* | 2/2017 | Han | G06F 1/1652 |
| 2017/0156219 A1* | 6/2017 | Heo | G02F 1/133305 |
| 2017/0222178 A1 | 8/2017 | Kang et al. | |
| 2017/0309226 A1* | 10/2017 | In | G06F 1/1652 |
| 2017/0367198 A1* | 12/2017 | Park | H01L 51/5237 |
| 2018/0087319 A1* | 3/2018 | McPherson | E06B 9/42 |
| 2018/0114471 A1* | 4/2018 | Park | G09F 9/301 |

FOREIGN PATENT DOCUMENTS

| | | |
|---|---|---|
| CN | 201193453 Y | 2/2009 |
| CN | 202560068 U | 11/2012 |
| CN | 103064243 A | 4/2013 |
| CN | 104715686 A | 6/2015 |
| CN | 104835416 A | 8/2015 |
| KR | 101570869 B1 | 11/2015 |
| WO | WO 2016024742 A1 | 2/2016 |

OTHER PUBLICATIONS

Second Office Action, Chinese Patent Application No. 201710291706.1, dated Aug. 14, 2019, 17 pages.

* cited by examiner (a)

(b)

ROLLABLE FLEXIBLE DISPLAY DEVICE

CROSS-REFERENCE TO RELATED APPLICATION

This application claims priority under 35 U.S.C. § 119(a) of Republic of Korea Patent Application No. 10-2016-0052167, filed on Apr. 28, 2016, which is hereby incorporated herein by reference in its entirety.

BACKGROUND

Technical Field

Embodiments of the present invention relate to a rollable display device.

Related Art

With the advancement of information technologies, the demands for display devices that enable a user to access information have increased. Accordingly, various types of the display device are widely used, such as Organic Light Emitting Display (OLED), Electrophoretic Display Device (ED), Liquid Crystal Display (LCD), and Plasma Display Panel (PDP).

Among the aforementioned display devices, the OLED includes a display panel having a plurality of subpixels, and a driving unit configured to drive the display panel. The driving unit includes a scan driver configured to supply a scan signal (or a gate signal) to the display panel, and a data driver configured to supply a data signal to the display panel.

The OLED may be flexibly designed, so that it is possible to bend or roll up a display panel of the OLED, to manufacture a display panel having a curved surface. For this reason, recently, many attempts have been made to design a display panel of the OLED and a receiving device for the display panel to have a variety of shapes.

SUMMARY

The present disclosure provides a rollable display device including a display panel configured to display an image, a panel roller having a mechanical structure that enables rolling up the display panel around an outer circumferential surface of the panel roller, and a roller driving unit configured to control a motor so that the display panel rolls around the outer circumferential surface of the panel roller or unrolls therefrom, wherein the roller driving unit and the motor are disposed in the panel roller.

BRIEF DESCRIPTION OF THE DRAWINGS

The accompany drawings, which are included to provide a further understanding of embodiments of the invention and are incorporated on and constitute a part of this specification illustrate embodiments of the invention and together with the description serve to explain the principles of embodiments of the invention.

DETAILED DESCRIPTION OF EXEMPLARY EMBODIMENTS

Reference will now be made in detail to embodiments of the invention, examples of which are illustrated in the accompanying drawings.

Hereinafter, embodiments of the present invention will be described with reference to the accompanying drawings.

In the following description, a rollable display device is implemented as an Organic Light Emitting Display (OLED). However, the rollable display device is not limited thereto, and may be implemented as an Electrophoretic Display Device (ED), a Liquid Crystal Display (LCD), and the like.

Figure 1:
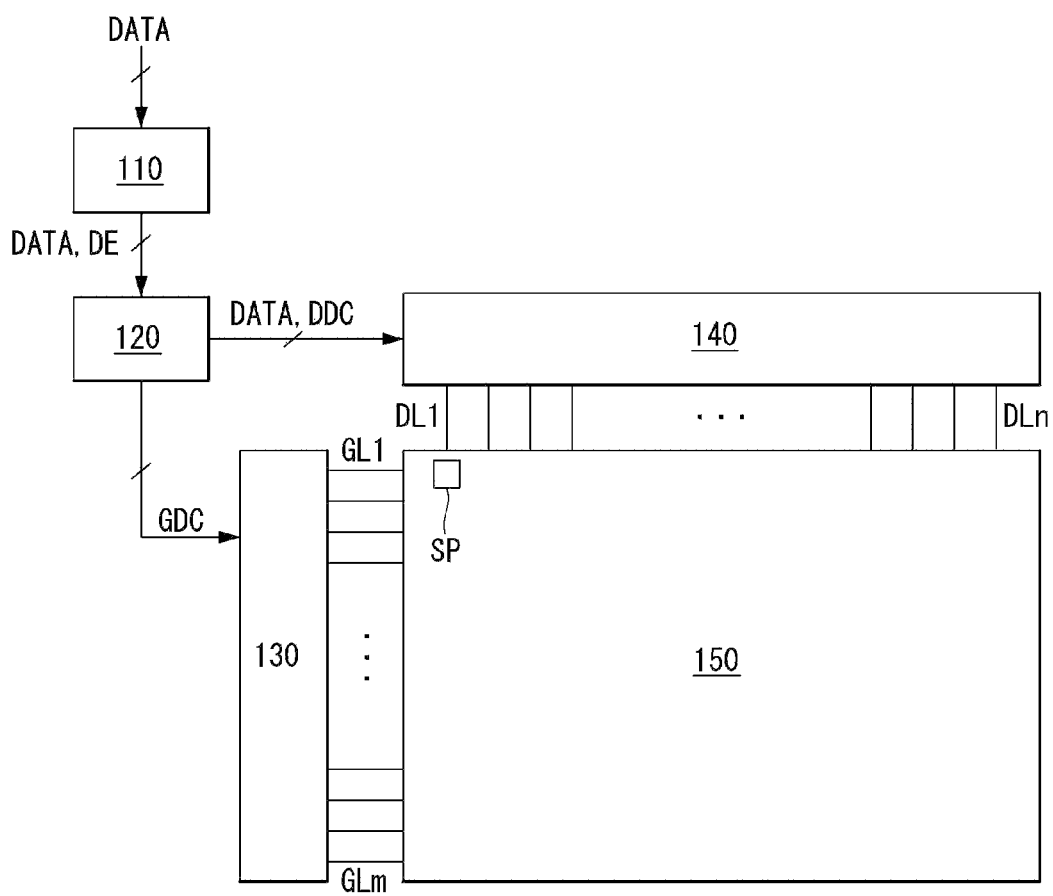
FIG. 1 is a schematic block diagram illustrating an Organic Light Emitting Display (OLED) according to an embodiment.
Figure 2:
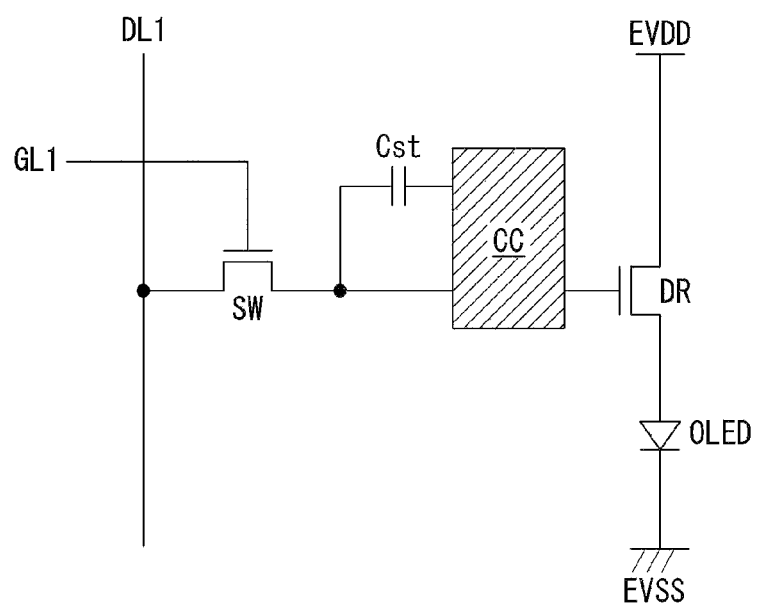
FIG. 2 is a schematic circuit diagram illustrating a subpixel according to an embodiment.
Figure 3:
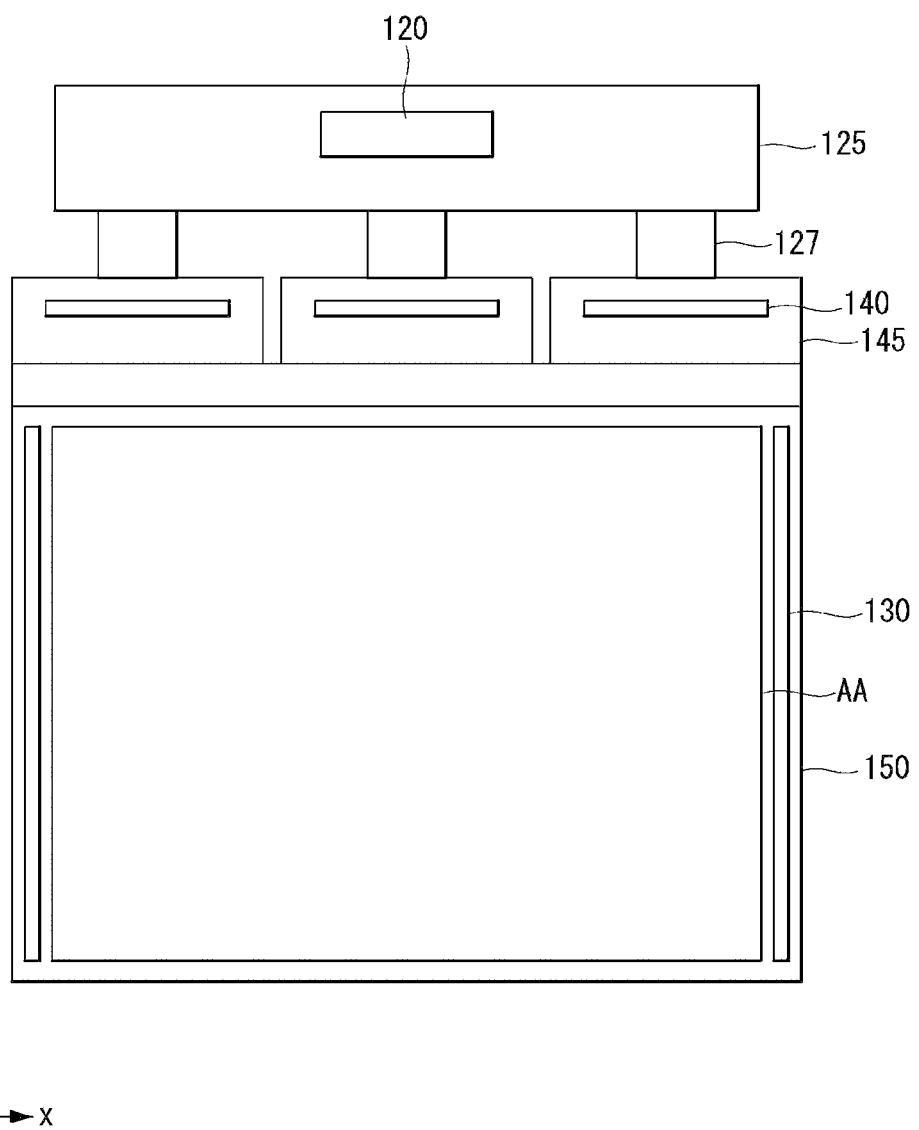
FIG. 3 is a top view illustrating a display panel and peripheral devices connected for modulation according to an embodiment.

FIG. 1 is a schematic block diagram illustrating an OLED according to an embodiment, FIG. 2 is a schematic circuit diagram illustrating a subpixel according to an embodiment, and FIG. 3 is a top view illustrating a display panel 150 and peripheral devices connected for modulation according to an embodiment.

As illustrated in FIG. 1, the OLED according to an embodiment of the present invention includes an image processor 110, a timing controller 120, a data driver 140, a scan driver 130, and a display panel 150.

The image processor 110 outputs a data enable signal (DE) along with a data signal DATA, which is supplied from outside the OLED. Besides the data enable signal DE, the image processor 110 may output one or more of a vertical synchronization signal, a horizontal synchronization signal, and a clock signal, but those signals are not depicted in the drawings for convenience of explanation.

The timing controller 120 is supplied by the image processor 110 with the data signal DATA as well as the data enable signal DE and a driving signal which may include the vertical synchronization signal, the horizontal synchronization signal, and the clock signal. Based on the driving signal, the timing controller 120 outputs a gate timing control signal GDC for controlling operation timing of the scan driver 130, and a data timing control signal DDC for controlling operation timing of the data driver 140.

In response to a data timing control signal DDC supplied from the timing controller 120, the data driver 140 samples and latches a data signal DATA, supplied from the timing controller 120, to thereby convert the data signal DATA into a gamma reference voltage and output the gamma reference voltage. The data driver 140 outputs the data signal through the data lines DL1 to DLn. The data driver 140 may be in the form of an Integrated Circuit (IC).

In response to a gate timing control signal GDC supplied from the timing controller 120, the scan driver 130 shifts a level of a gate voltage to thereby output a scan signal. The scan driver 130 outputs the scan signal through scan lines GL1 to GLm. The scan driver 130 may be in the form of an IC or may be formed in a Gate In Panel (GIP) structure on the display panel 150.

In response to a data signal DATA supplied from the data driver 140 and a scan signal supplied from the scan driver 130, the display panel 150 displays an image. The display panel 150 may include subpixels SP that operate to display an image. The subpixels SP are formed on a flexible board that is able to be bent or curved.

The subpixels are formed in a top-emission type structure, a bottom-emission type structure, or a dual-emission type structure. The subpixels may include red, green, and blue subpixels, or may include white, red, green, and blue subpixels. The subpixels SP may have one or more different emission areas according to emission characteristics.

As illustrated in FIG. 2, one subpixel includes a switching transistor SW, a drive transistor DR, a capacitor Cst, a compensation circuit CC, and an organic light emitting diode (OLED).

In response to a scan signal supplied through a first scan line GL1, the switching transistor SW performs a switching operation to store a data signal, supplied through a first data line DL1, as a data voltage in the capacitor Cst. According to the data voltage stored in the capacitor Cst, the drive transistor DR enables a current to flow between a first power line EVDD and a second power line EVSS. According to a driving current generated by the drive transistor DR, the organic light emitting diode (OLED) emits light.

The compensation circuit CC is a circuit that is added in a subpixel to compensate for a threshold voltage of the drive transistor DR. The compensation circuit CC is composed of one or more transistors. The compensation circuit CC may be configured in various ways depending on a compensation method known to one of ordinary skill in the art, and thus, detailed description thereof is omitted.

As illustrated in FIG. 3, the display panel 150 and its peripheral devices are connected for modulation. The scan driver 130 is formed in the GIP structure in a non-display area of the display panel 150. The data driver 140 is in the form of an IC mounted on a source board 145. The timing controller 120 is in the form of an IC mounted on a control board 125.

To make the display panel 150 in a rollable form, the scan driver 130 may be formed in the GIP structure on either or both of the left side and the right side of a display area AA of the display panel 150, but aspects of embodiments of the present invention are not limited thereto. In addition, the data driver 140 may be mounted on the source board 145 composed of a flexible printed circuit board, and the timing controller 120 may be mounted on a control board 125 composed of a printed circuit board (PCB), but aspects of embodiments of the present invention are not limited thereto. In addition, the source board 145 and the control board 125 may be connected via a connector such as a cable 127, but aspects of embodiments of the present invention are not limited thereto.

Hereinafter, there is provided description about a mechanical structure used to realize a rollable display device.

Figure 4:
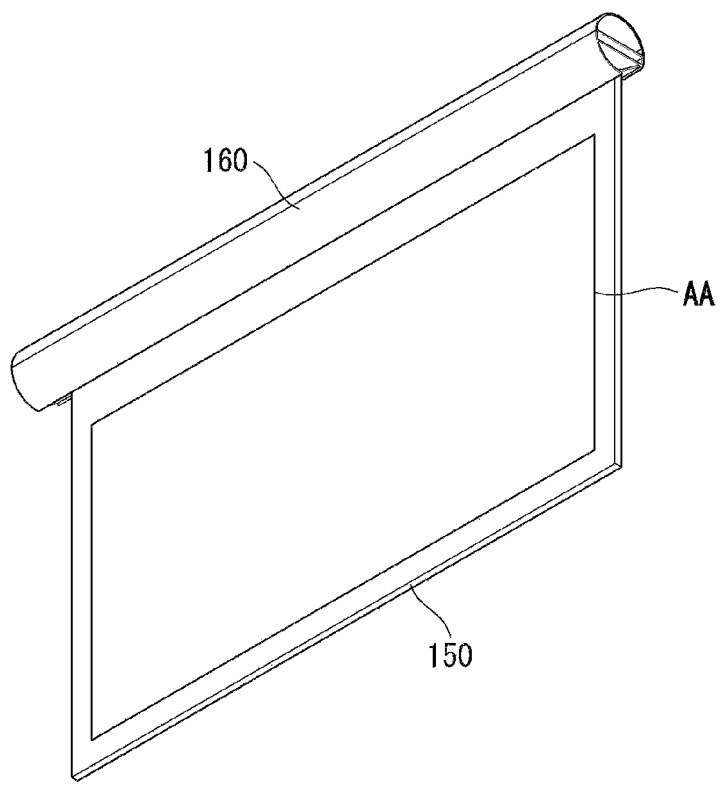
FIG. 4 is a perspective view illustrating a rollable display device according to an embodiment.
Figure 5:
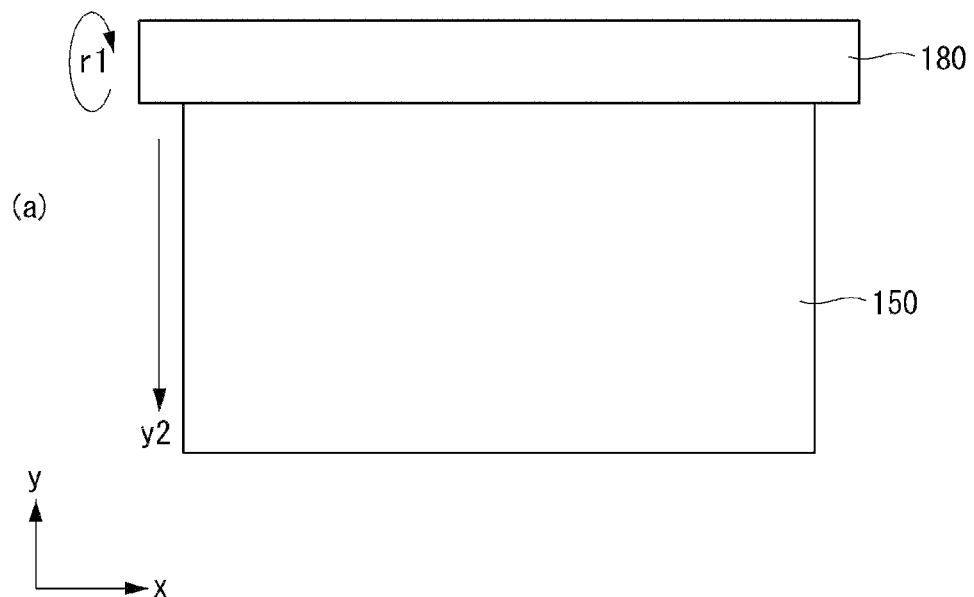
FIG. 5 is a diagram showing the concept of the rollable display device according to an embodiment.
Figure 5:
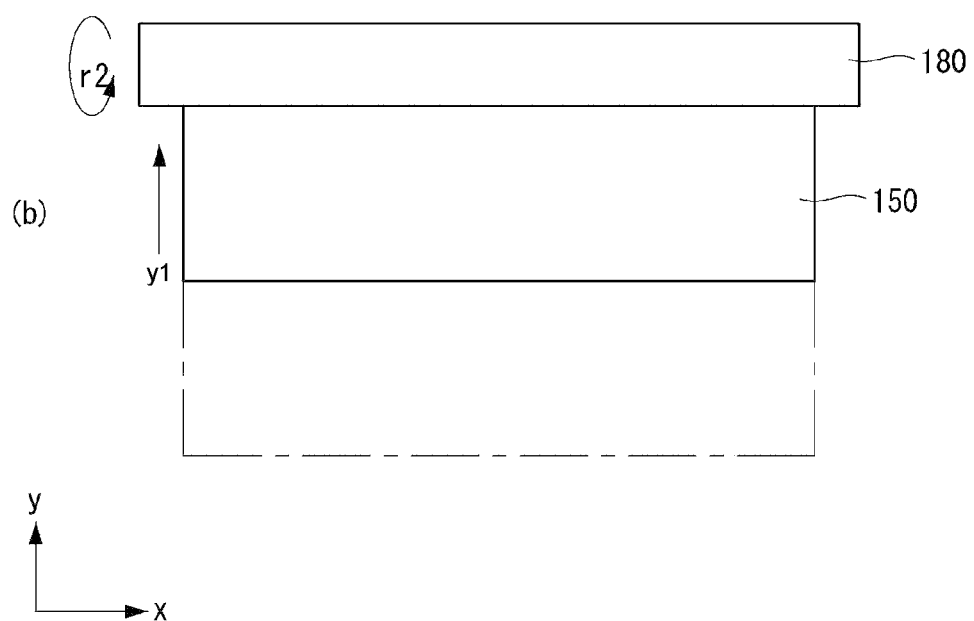
Figure 6:
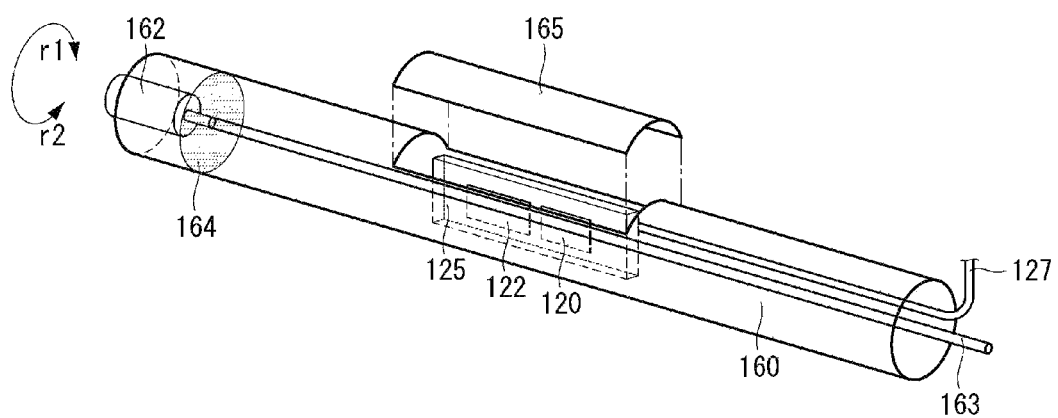
FIG. 6 is a perspective view illustrating a panel roller according to an embodiment.
Figure 7:
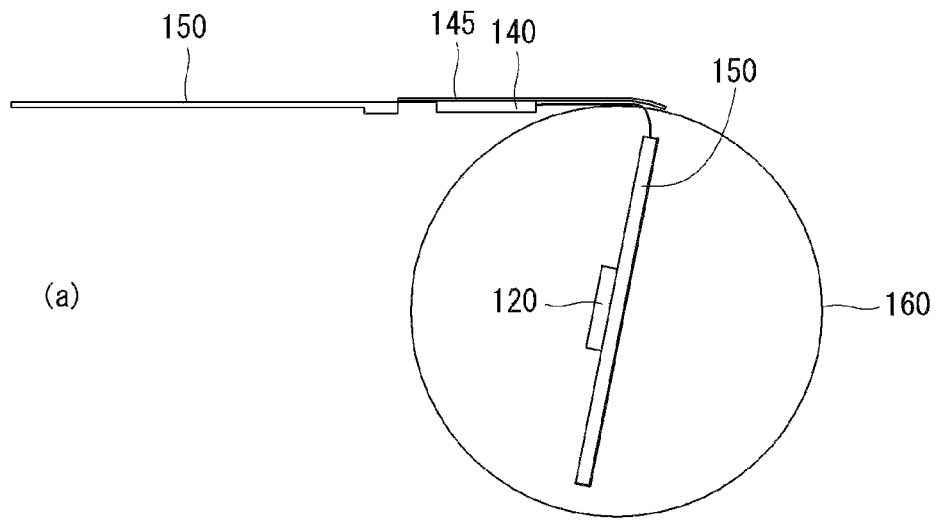
FIG. 7 is a cross-sectional view illustrating a control board of the panel roller according to an embodiment.
Figure 7:
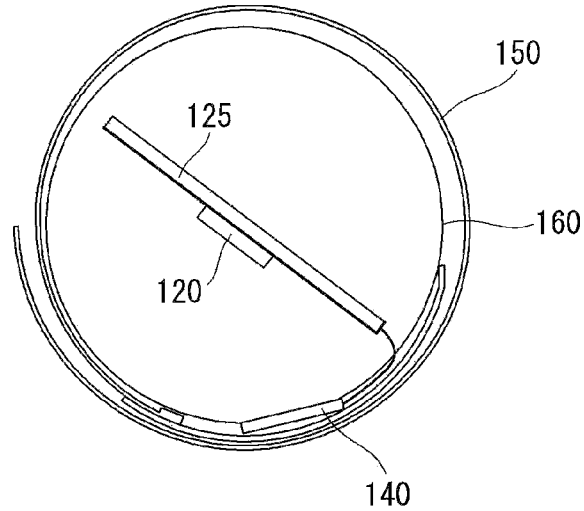

FIG. 4 is a perspective view illustrating a rollable display device according to an embodiment, FIG. 5 is a diagram showing the concept of the rollable display device according to an embodiment, FIG. 6 is a perspective view illustrating a panel roller 160 according to an embodiment, and FIG. 7 is a cross-sectional view illustrating a control board 125 of the panel roller 160 according to an embodiment.

As illustrated in FIGS. 4 and 5, a rollable display device according to an embodiment includes a modulated display panel 150 (hereinafter, referred to as a display panel 150), a panel roller 160, and a receiving part 180. The display panel 150 may be flexible or curved and thus rollable.

The panel roller 160 has a circular cross-section. The panel roller 160 enables rolling the display panel 150 around the outer circumferential surface of the panel roller 160 and unrolling the display panel 150 therefrom. The panel roller 160 is inside the receiving part 180.

The receiving part 180 receives the display panel 150 and the panel roller 160. A driving device for electrically rotating the panel roller 160, such as a motor, a gear, and a power supply, may be included inside the receiving part 180. According to configuration or design of the driving device, the cross-section of the receiving part 180 may be in a circular, elliptical, quadrangular, rectangular, or polygonal shape.

According to a direction of rotation of the driving device, the display panel 150 comes out of the receiving part 180 or goes inside the receiving part 180. For example, if the driving device rotates in direction r1, as shown in the example (a) of FIG. 5, the panel roller 160 may unroll the display panel 150 rolled up around its outer circumferential surface. In this case, the display panel 150 moves in direction y2 to thereby come out of the receiving part 180. On contrary, if the driving device rotates in direction r2, as shown in the example (b) of FIG. 5, the panel roller 160 rolls up the display panel 150 around its outer circumferential surface. In this case, the display panel 150 moves in direction y1 to thereby go inside the receiving part 180.

As illustrated in FIGS. 6 and 7, the control board 125 and a motor 162 is inside the panel roller 160. A motor controller 122 is mounted on the control board 125. As described above, other devices such as a timing controller 120 or a power supply may also be mounted on the control board 125.

The panel roller 160 includes a cover 165. To allow the control board 125 to be exposed, the cover 165 is disposed to correspond to an area in which the control board 125 is received. Due to the presence of the cover 165, the control board 125 is able to be detached from the panel roller 160, and this make it easy to maintain and repair devices mounted on the control board 125.

The motor 162 is controlled by the motor controller 122 to thereby rotate in a direction to roll or unroll the display panel 150. The motor 162 is connected to a roller rotating part 164 (or a roller connection flange) and a rotation shaft 163. Meanwhile, the rotation shaft 163 protrudes from one end and the other end of the panel roller 160 to thereby be extended and inserted into grooves of the receiving part 180.

A torque generated by operation of the motor 162 is transferred to the panel roller 160. According to a direction of rotation of the motor 162, the panel roller 160 rotates in direction r1 or direction r2. If the panel roller 160 rotates in direction r1, as previously shown in the example (a) of FIG. 5, the display panel 150 unrolls from the outer circumferential surface of the panel roller 160. If the panel roller 160 rotates in direction r2, as previously shown in the example (b) of FIG. 5, the display panel 150 rolls around the outer circumferential surface of the panel roller 160.

Hereinafter, there is provided description about a driving device inside the panel roller 160.

Figure 8:
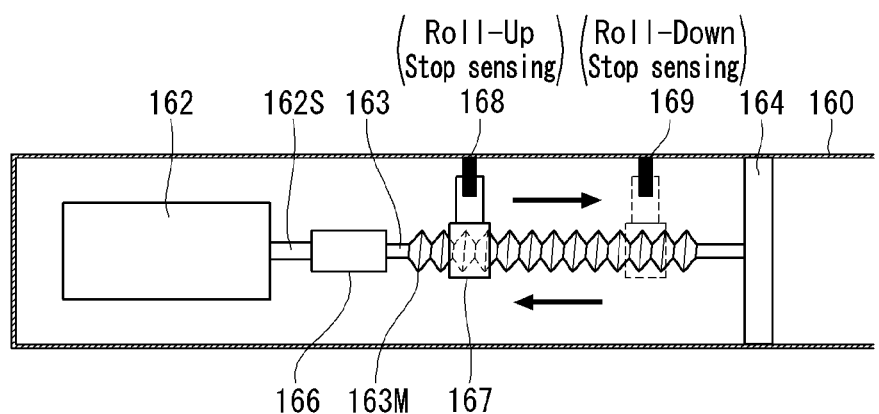
FIG. 8 is a diagram showing an area around a motor of a panel roller according to an embodiment.
Figure 9:
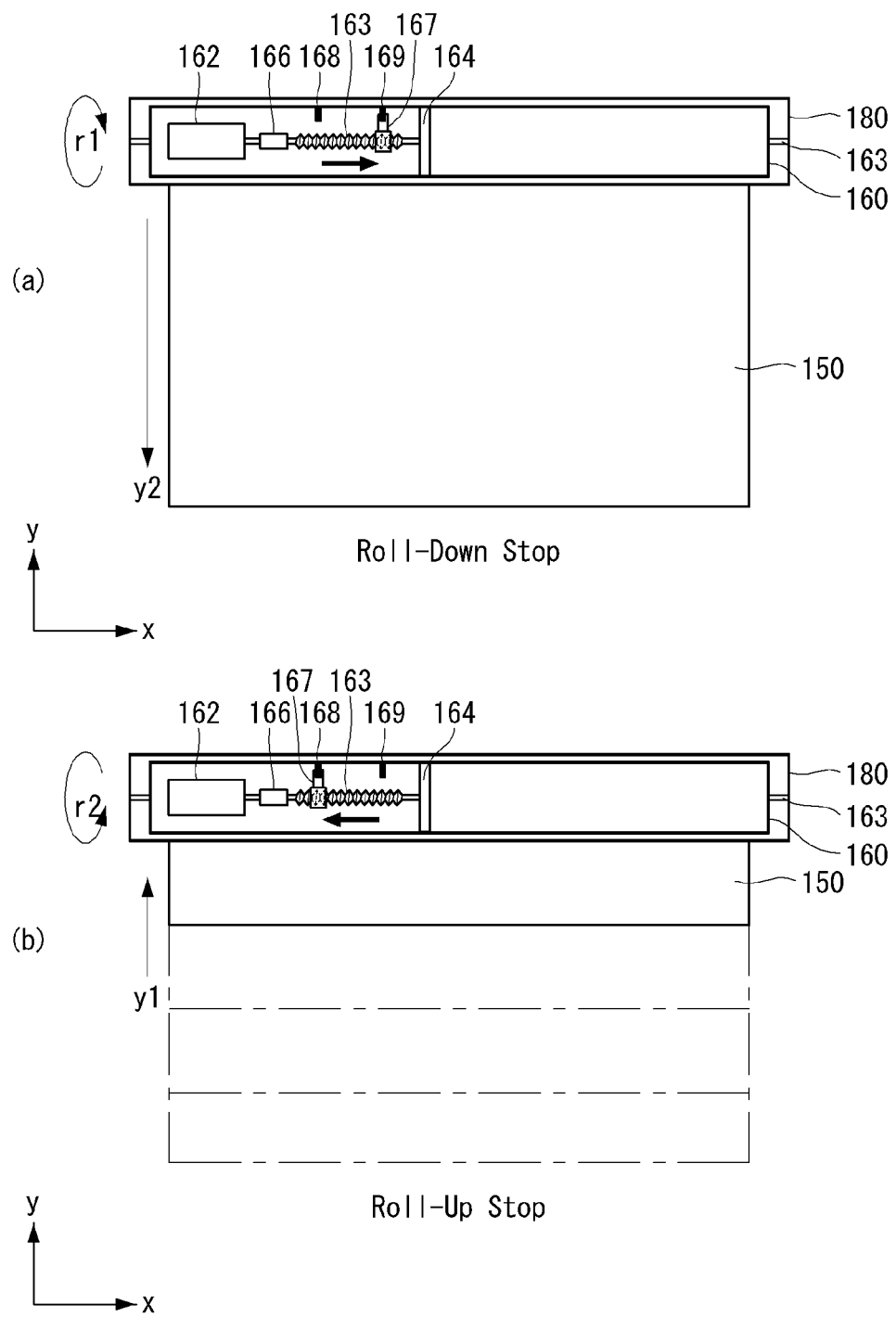
FIG. 9 is a diagram illustrating operation of a display panel according to an embodiment.

FIG. 8 is a diagram showing an area around a motor of a panel roller 160 according to an embodiment, and FIG. 9 is a diagram illustrating operation of a display panel 150 according to an embodiment.

As illustrated in FIGS. 8 and 9, the panel roller 160 includes a panel roller drive unit which includes a motor 162, a rotation shaft 163, a roller rotating part 164, a connector 166, a moving part 167, a first stop sensor 168, and a second stop sensor 169.

A motor shaft 162S is coupled to the connector 166 that transfers a torque generated by the motor 162. The connector 166 is a device that connects the roller rotating part 164 and the motor shaft 162S. The roller rotating part 164 includes: a body coupled and fixed onto the inner wall of the panel roller 160; the rotation shaft 163 elongated from the center of the body; and a shaft screw thread 163M on a section of the rotation shaft 163.

The moving part 167 is engaged with the shaft screw thread 163M. While being engaged with the shaft screw thread 163M, the moving part 167 moves in the left direction or the right direction along an axis parallel to the axis of rotation of the shaft screw thread 163M (that is, linear back-and-forth movement orthogonal to the rotation direction of the shaft screw thread 163M). The moving part 167 may further include a rail which stabilizes movement in the left or right direction orthogonal to the rotation direction of the shaft screw thread 163M. The rail helps the moving part 167 to stably move without being disengaged from the shaft screw thread 163M.

A first stop sensor (or a roll-up stop sensor) 168 and a second stop sensor (or a roll-down stop sensor) 169 is installed onto the inner wall of the panel roller 160, while being spaced apart from each other. The first stop sensor 168 limits how much the display panel 150 is rolled around the outer circumferential surface of the panel roller 160, and thus, the first stop sensor 168 may be defined as a roll-up stop sensor. The second stop sensor 169 limits how much the display panel 150 is unrolled from the outer circumferential surface of the panel roller 160, and thus, the second stop sensor 169 may be defined as a roll-down stop sensor. Each of the first stop sensor 168 and the second stop sensor 169 may be selected from among an optical sensor, a proximity sensor, a touch sensor, or other suitable types of sensors. A distance between the first stop sensor 168 and the second stop sensor 169 may be based on a size of the display panel 150 or how long the display panel 150 is able to roll or unroll.

The first stop sensor 168 and the second stop sensor 169 are electrically connected to the motor controller 122. The first stop sensor 168 and the second stop sensor 169 operate in conjunction with the motor controller 122 to stop rotation of the motor 162.

The rollable display device according to an embodiment of the present invention is able to roll around the outer circumferential surface of the panel roller 160 or unroll therefrom within a set (or designed) range based on the driving device shown in FIG. 8, and such operation will be described in the following.

As illustrated in the example (a) of FIG. 9, a roll-down operation is performed in a manner in which the display panel 150 starts to roll in direction y2 in response to rotation of the motor 162 in the r1 direction. After a certain period of time, the moving part 167 is sensed by the second stop sensor 169. The second stop sensor 169 transmits a second detection signal to the motor controller 122 to notify that the moving part 167 has reached where the second stop sensor 169 is positioned. Responsive to receiving the second detection signal, the motor controller 122 determines that the display panel 150 has come down to a preset location (or determines that the display panel 150 has unrolled from the panel roller 160) and stops the motor 162 from rotating further in the r1 direction (stopping the roll-down operation).

As shown in the example (b) of FIG. 9, a roll-up operation is performed in such a manner that the display panel 150 is rolled up in direction y1 in response to rotation of the motor 162 in the r2 direction. After a certain period of time, the moving part 167 is sensed by the first stop sensor 168. The first stop sensor 168 transmits a first detection signal to the motor controller 122 to notify that the moving part 167 has reached where the first stop sensor 168 is positioned. Responsive to receiving the first detection signal, the motor controller 122 determines that the display panel 150 has been rolled up to a preset location (or determines that the display panel 150 has been rolled up around the panel roller 160) and stops the motor 162 from rotating further in the r2 direction (stopping the roll-up operation).

Hereinafter, there is provided description about a panel roller drive unit, which is provided inside the panel roller 160, according to another embodiment.

Figure 10:
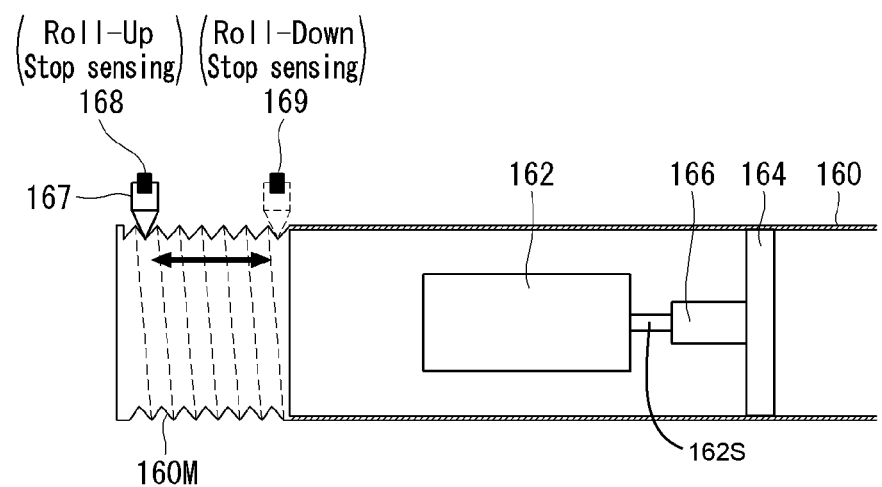
FIG. 10 is a diagram showing an area around a motor of a panel roller according to an embodiment.
Figure 11:
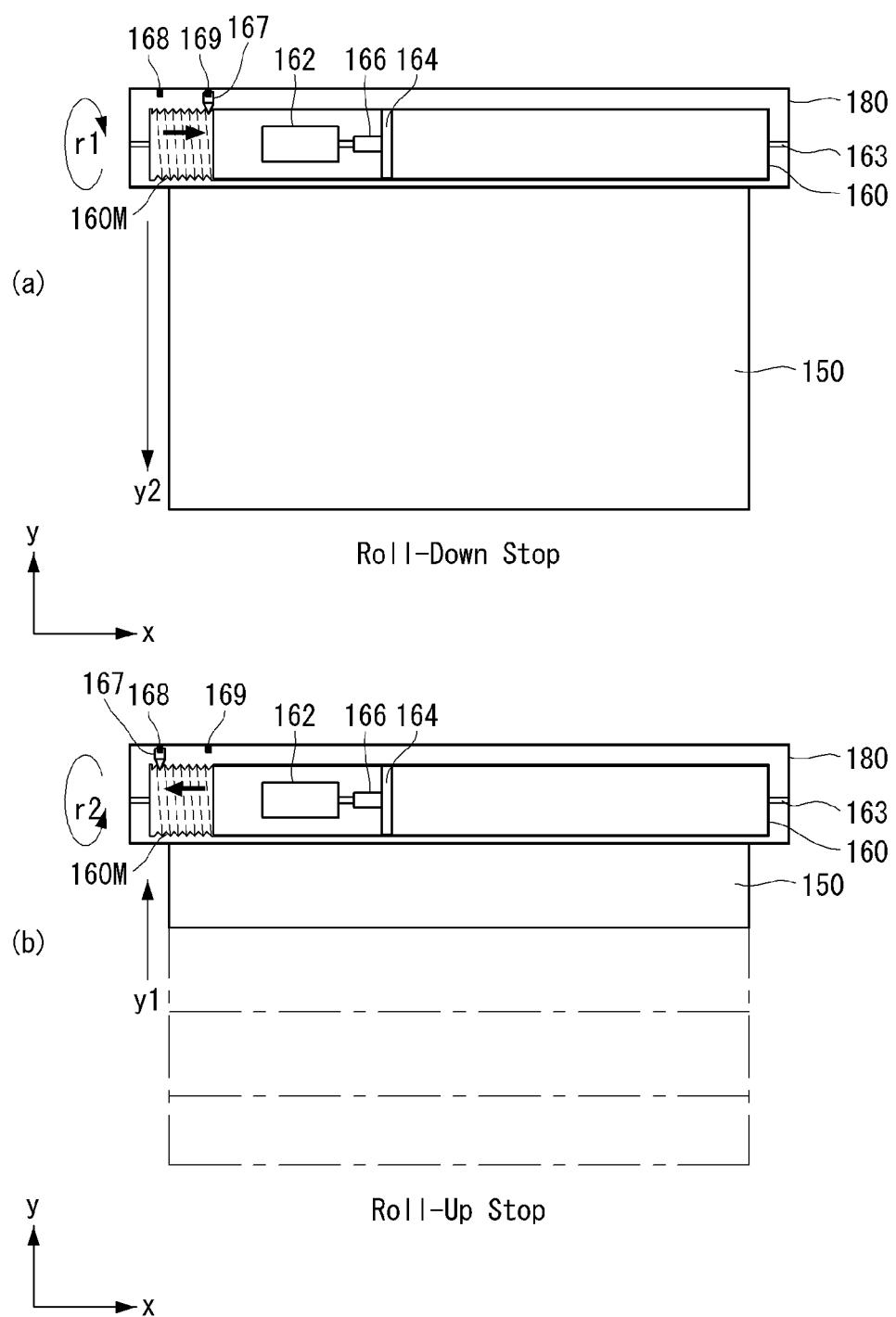
FIG. 11 is a diagram illustrating operation of the display panel according to an embodiment.

FIG. 10 is a diagram showing an area around a motor 162 of a panel roller 160 according to an embodiment, and FIG. 11 is a diagram illustrating operation of the display panel 150 according to an embodiment.

As illustrated in FIGS. 10 and 11, a roller screw thread 160M is provided on the outer circumferential surface of the panel roller 160. The roller screw thread 160M may be adjacent to one end or the other end of the panel roller 160.

Inside the panel roller 160, there is an internal driving device which includes a motor 162, a rotation shaft 163, a roller rotating part 164, and a connector 166. Outside the panel roller 160, there is an external driving device which includes a moving part 167, a first stop sensor 168, and a second stop sensor 169. The panel roller 160 is controlled by a roller driving unit which includes the internal driving device and the external driving device.

A motor shaft 162S is coupled to the connector 166 that transfers a torque, generated by the motor 162, to a different component. The connector 166 is a component that connects the roller rotating part 164 to the motor shaft 162S. The roller rotating part 164 includes a body fixed onto the inner wall of the panel roller 160, and a rotation shaft 163 elongated from the center of the body.

The moving part 167 moves in the left or right direction along an axis parallel to the axis of rotation of the roller screw thread 160M, which is positioned on the outer circumferential surface of the panel roller 160 (that is, linear back-and-forth movement orthogonal to the rotation direction of the roller screw thread 160M). The moving part 167 may further include a rail that stabilizes movement in the left or right direction orthogonal to the rotation direction of the roller screw thread 160M. The rail helps the moving part 167 to stably move without being disengaged from the roller screw thread 160M when linear movement of the moving part 167 is performed based on rotation of the panel roller 160.

The first stop sensor (or a roll-up stop sensor) 168 and the second stop sensor (or a roll-down stop sensor) 169 are installed onto the outer circumferential surface of the panel roller 160, while being spaced apart from each other. Each of the first stop sensor 168 and the second stop sensor 169 may be selected from among an optical sensor, a proximity sensor, a touch sensor, or other suitable types of sensors. A distance between the first stop sensor 168 and the second stop sensor 169 may be based on a size of the display panel 150 or how long the display panel 150 is able to roll or unroll.

The first stop sensor 168 and the second stop sensor 169 are electrically connected to the motor controller 122. The first stop sensor 168 and the second stop sensor 169 operate in conjunction with the motor controller 122 to stop rotation of the motor 162.

The rollable display device according to an embodiment of the present invention is able to roll or unroll within a set (or designed) range based on the driving device shown in FIG. 10, and such operation will be described in the following.

As illustrated in the example (a) of FIG. 11, a roll-down operation is performed in a manner in which the display panel 150 starts to unroll in direction y2 in response to rotation of the motor 162 in the direction r1. After a certain period of time, the moving part 167 is sensed by the second stop sensor 169. The second stop sensor 169 transmits a second detection signal to the motor controller 122 to notify that the moving part 167 has reached the location of the second stop sensor 169. Responsive to receiving the second detection signal, the motor controller 122 determines that the display panel 150 has come down to a preset location (or determines that the display panel 150 has unrolled from the panel roller 160) and stops the motor 162 from rotating further in the direction r1 (stopping the roll-down operation).

As shown in the example (b) of FIG. 11, a roll-up operation is performed in such a manner that the display panel 150 is rolled up in direction y1 in response to rotation of the motor 162 in the direction r2. After a certain period of time, the moving part 167 is sensed by the first stop sensor 168. The first stop sensor 168 transmits a first detection signal to the motor controller 122 to notify that the moving part 167 has reached where the first stop sensor 168 is positioned. Responsive to receiving the first detection signal, the motor controller 122 determines that the display panel 150 has come up to a preset location (or determines that the display panel 150 has rolled around the panel roller) and stops the motor 162 from rotating further in the direction r2 (stopping the roll-up operation).

Figure 12:
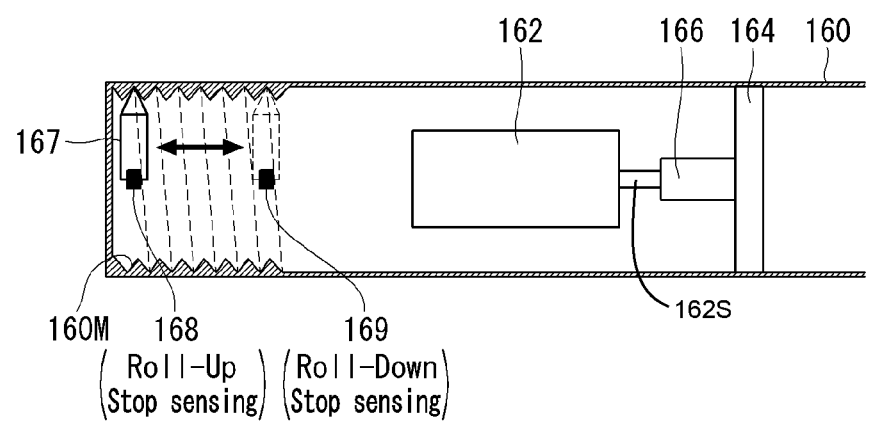
FIG. 12 is a diagram showing an area around a motor of a panel roller according to an embodiment.
Figure 13:
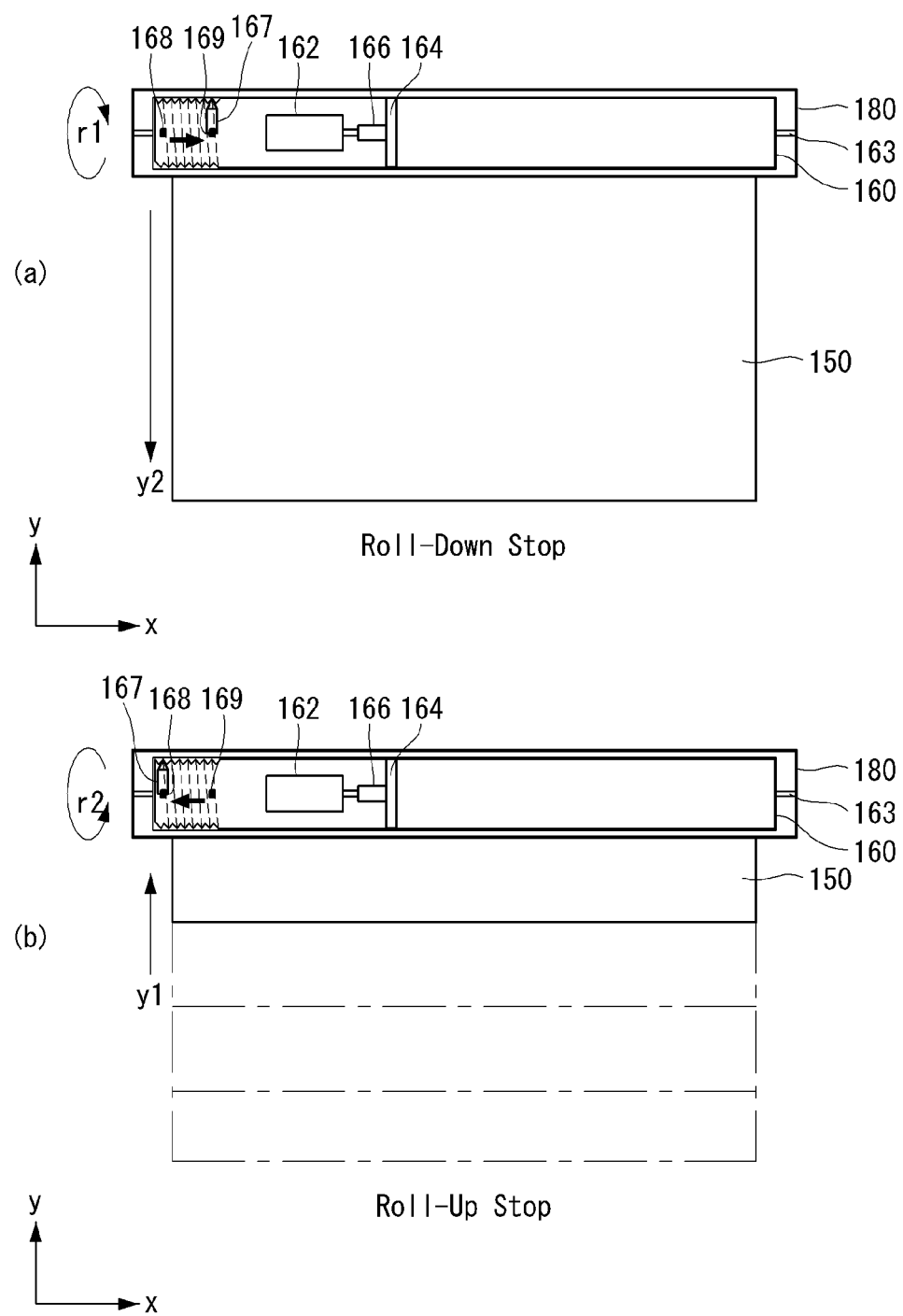
FIG. 13 is a diagram illustrating operation of a display panel according to an embodiment.

FIG. 12 is a diagram showing an area around a motor of a panel roller 160 according to an embodiment, and FIG. 13 is a diagram illustrating operation of a display panel 150 according to an embodiment.

As illustrated in FIGS. 12 and 13, a roller screw thread 160M is provided on the inner circumferential surface of the panel 160. The roller screw thread 160M may be adjacent to one end or the other end of the panel roller 160.

Inside the panel roller 160, there is an internal driving device which includes a motor 162, a rotation shaft 163, a roller rotating part 164, and a connection part 166. Outside the panel roller 160, there is provided an external driving device which includes a moving part 167, a first stop sensor 168, and a second stop sensor 169. The panel roller 160 is controlled by a roller driving unit which includes the internal driving device and the external driving device.

A motor shaft 162S is coupled to the connection part 166 which transfers a torque, generated by the motor 162, to a different component. The connection part 166 is a component that connects the roller rotating part 164 to the motor shaft 162S. The roller rotating part 164 includes a body coupled and fixed onto the inner wall of the panel roller 160, and the rotation shaft 163 elongated from the center of the body.

The moving part 167 moves in the left or right direction along an axis parallel to the axis of rotation of the roller screw thread 160M which is positioned on the inner circumferential surface of the panel roller 160 (that is, linear back-and-forth movement orthogonal to the rotation direction of the roller screw thread 160M). The moving part 167 may further include a rail that stabilizes movement in the left or right direction orthogonal to the rotation direction of the roller screw thread 160M. The rail helps the moving part 167 to stably move without being disengaged from the roller screw thread 160M when linear movement of the moving part 167 is performed based on rotation of the panel roller 160.

The first stop sensor (or a roll-up stop sensor) 168 and the second stop sensor (or a roll-down stop sensor) 169 may be installed on the inner circumferential surface of the panel roller 160, with being spaced apart from each other. Each of the first stop sensor 168 and the second stop sensor 169 may be selected from among an optical sensor, a proximity sensor, a touch sensor, or other suitable types of sensors. A distance between the first stop sensor 168 and the second stop sensor 169 may be based on a size of the display panel 150 or how long the display panel 150 is able to roll or unroll.

The first stop sensor 168 and the second stop sensor 169 are electrically connected to the motor controller 122. The first sensor 168 and the second stop sensor 169 operate in conjunction with the motor controller 122 to stop the motor 162 from rotating.

The rollable display device according to an embodiment of the present invention is able to roll up or down within a set (designed) range based on the driving device shown in FIG. 12, and such operation will be described in the following.

As illustrated in the example (a) of FIG. 13, a roll-down operation is performed in a manner in which the display panel 150 starts to unroll in direction y2 in response to rotation of the motor 162 in the direction r1. After a certain period of time, the moving part 167 is sensed by the second stop sensor 169. The second stop sensor 169 transmits a second detection signal to the motor controller 122 to notify that the moving part 167 has reached where the second stop sensor 169 is positioned. Responsive to receiving the second detection signal, the motor controller 122 determines that the display panel 150 has come to a preset location (or determines that the display panel 150 has unrolled from the panel roller 160) and stops the motor 162 from rotating further in the direction r1 (stopping the roll-down operation).

As shown in the example (b) of FIG. 13, a roll-up operation is performed in such a manner that the display panel 150 rolls in direction y1 in response to rotation of the motor 162 in the direction r2. After a certain period of time, the moving part 167 is sensed by the first stop sensor 168. The first stop sensor 168 transmits a first detection signal to the motor controller 122 to notify that the moving part 167 has reached where the first stop sensor 168 is positioned.

Responsive to receiving the first detection signal, the motor controller 122 determines that the display panel 150 has come up to a preset location (or determines that the display panel 150 has rolled around the panel roller 160) and stops the motor 162 from rotating further in the direction r2 (stopping the roll-up operation).

The aforementioned embodiments of the present invention may make a product (e.g., a display device including an OLED) smaller and light-weighted, because a control board 125 for controlling a display panel 150 and a motor 162 for rotating a roller are arranged inside a panel roller 160. In addition, the embodiments may stabilize and automate operation of a product, because stopping rolling up or down a display panel 150 is directed by sensors.

Hereinafter, there are descriptions for embodiments by which noise caused by operation of a rollable display device can be reduced.

Figure 14:
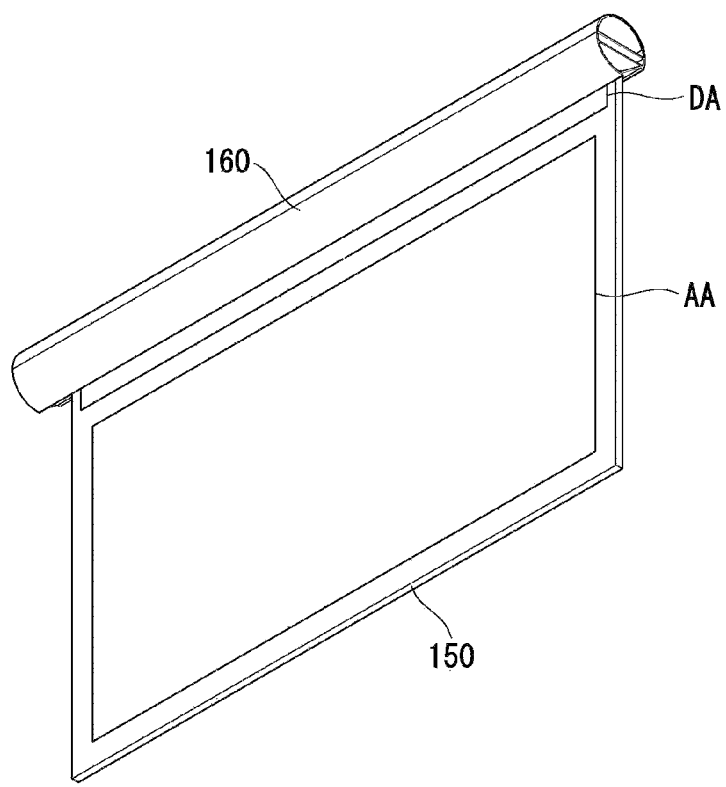
FIGS. 14 and 15 are perspective views illustrating a rollable display device according to an embodiment.
Figure 15:
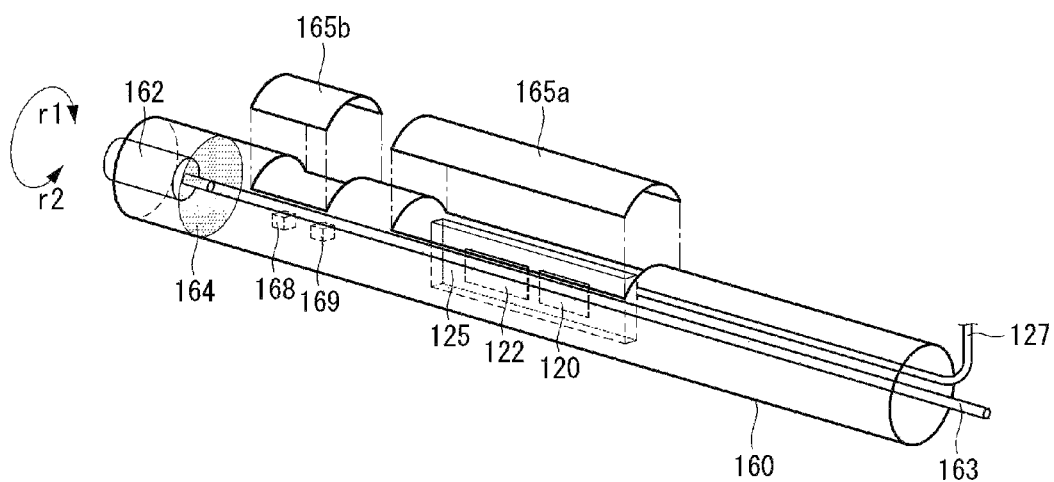
Figure 16:
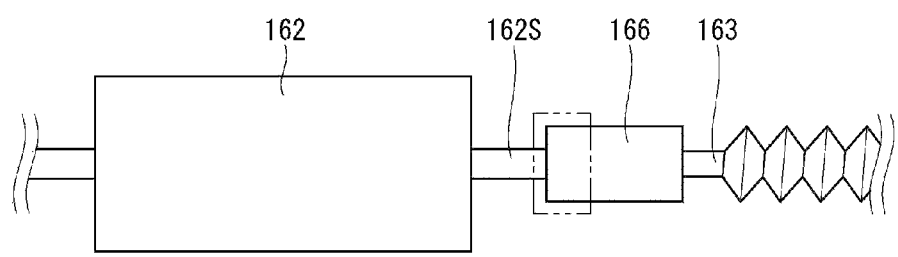
FIGS. 16 to 19 are diagrams for explanation of sound absorption material of a rollable display device according to an embodiment.
Figure 20:
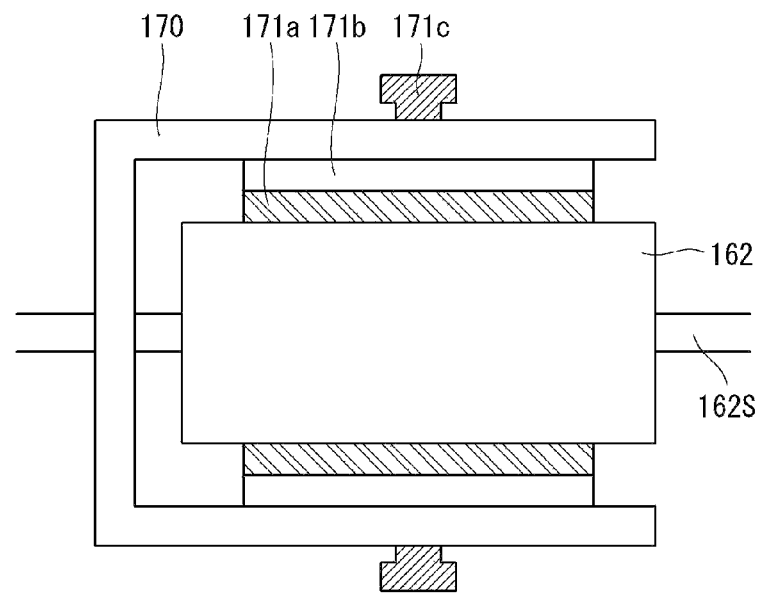
FIGS. 20 and 21 are diagrams also for explanation of sound absorption material of a rollable display device according to an embodiment.
Figure 21:
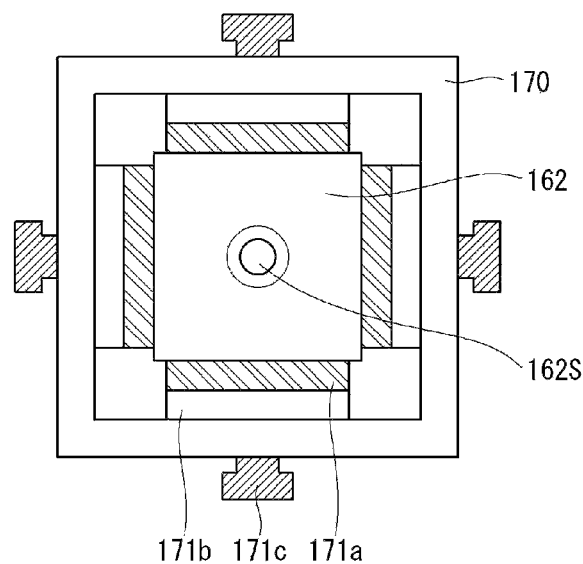

FIGS. 14 and 15 are diagrams perspective views of a rollable display device according to an embodiment. FIGS. 16 to 19 are diagrams for explanation of sound absorption material of a rollable display device according to an embodiment. FIGS. 20 and 21 are diagrams also for explanation of sound absorption material of a rollable display device according to an embodiment.

As illustrated in FIGS. 14 and 15, the display panel 150 includes a display area AA and a dummy area DA according to an embodiment. Unlike the display area AA, the dummy area DA does not display an image. The dummy area DA is an extended area that is provided to allow a user to set a position of the display area AA at an eye level of the user. For example, if the dummy area DA is long, it is possible to adjust the position of the display area AA of the display panel 150, which is rolled up around the panel roller 160, so as to correspond to the user's eye level (setting and changing a stop section at the user's eye level).

If the dummy area DA exists in the display panel 150, the positions of a first stop sensor 168 and a second stop sensor 169 may be adjusted, which control stopping of a roll-up operation and a roll-down operation.

To this end, the panel roller 160 includes a second cover 165b which allows an area, where the first stop sensor 168 and the second stop sensor are positioned, to be exposed. The second cover 165b may cover the area where the first stop sensor 168 and the second stop sensor 169 are installed inside the panel roller 160. The second cover 165b may be positioned on either or both of the left side and the right side of a first cover 165a that allows the control board 125 to be exposed.

As described above, in an embodiment of the present invention, it is possible to provide a mechanical structure that allows a user to adjust a stop section at the user's eye level.

As illustrated in FIGS. 16 to 19, a motor shaft 162S is coupled to a connection part 166 that transfers a torque, generated by the motor 162, to a different component according to an embodiment. The connection part 166 is a component that connects the motor shaft 162S of the motor 162 to a rotation shaft 163 of the roller rotating part.

The connection part 166 further includes: one or more sound absorption materials 166a installed inside the connector 166 to cover at least a part of the motor shaft 162S; one or more plates 166b which press the sound absorption material(s) 166a; and one or more bolts 166c which are installed outside the connector 166 to fix the sound absorption material(s) 166a and the plate(s) 166b to the motor shaft 162S. The bolt 166c is fitted into a hole (not shown in FIGS. 17-18) formed in the connection part 166 and fixed so as to push the plate 166b toward the motor shaft 162S.

The sound absorption material 166a may be formed of a material including rubber, urethane, and the like, which are elastic enough to absorb vibration and not slippery. The plate 166b may be formed of a metal material and the like, which is able to press the sound absorption material 166a onto the motor shaft 162S so that the sound absorption material 166a may be firmly attached to the motor shaft 162 without causing deformation of the sound absorption material 166a.

Figure 18:
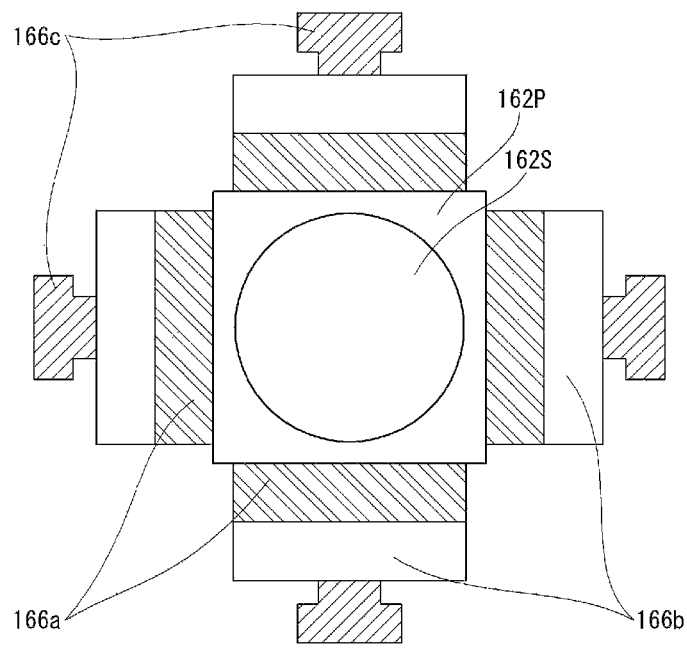
Figure 19:
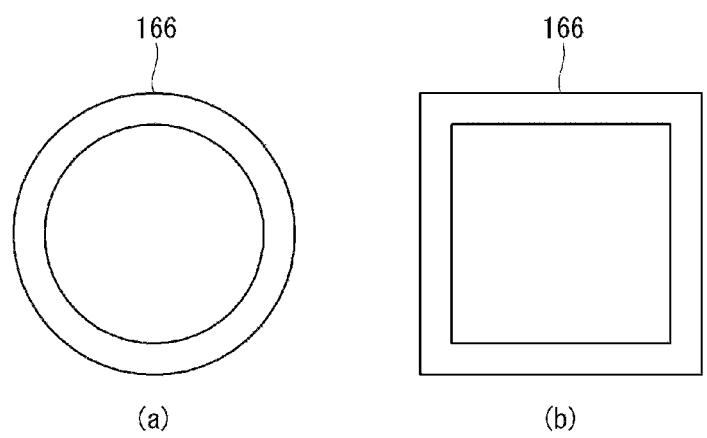

The connection part 166 may have a circular shaped cross-section (see (a) in FIG. 19) or a quadrangular shaped cross-section (see (b) in FIG. 19). If the cross-section of the connector part 166 is in the quadrangular shape, the sound absorption material(s) 166a and the plate(s) 166b may be provided in the linear shape, as shown in FIG. 18. However, if the cross-section of the connector part 166 is in the circular shape, the sound absorption material(s) 166a and the plate(s) 166b are provided in the circular shape.

In addition, FIG. 18 shows an example in which the sound absorption materials 166a, the plates 166b, and the bolts 166c are provided in four areas to surround the motor shaft 162S because the motor shaft 162S is in the circular shape. However, the arrangement of the sound absorption materials 166a, the plates 166b, and the bolts 166c may be changed depending on shape of the motor shaft 162S. For example, the sound absorption materials 166a, the plates 166b, and the bolts 166c may be provided in two areas to surround the motor shaft 162S.

In addition, if the motor shaft 162S is in the circular shape, not the quadrangular shape, as shown in FIG. 18, there may be further provided a fixing pin 162P which has a circular inner circumferential surface in contact with the motor shaft 162S and has a quadrangular outer circumferential surface in contact with the sound absorption material(s) 166a, and the fixing pin 162P may be fitted on the motor shaft 162S.

Figure 17:
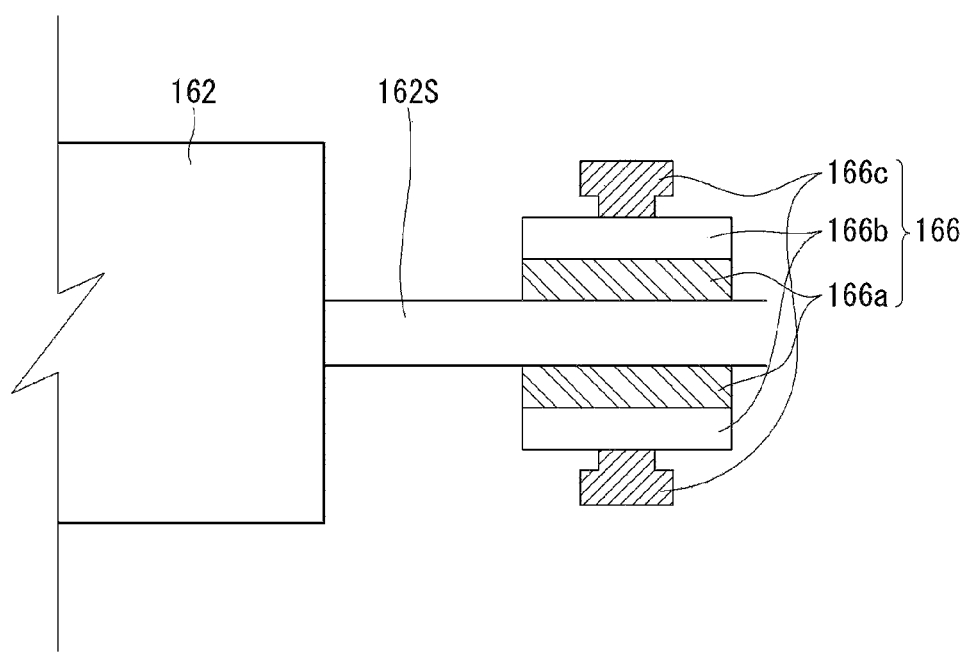

FIGS. 17 and 18 are views in which the connection part 166 is not shown for purposes of illustration and which mainly show the sound absorption materials 166a, the plates 166b, and the bolts 166c positioned on part of the motor shaft 162S.

Since the motor 162 is installed inside the panel roller 160, noise caused by vibration due to a torque of the motor 162 may be generated and spread to the outside. However, if the connection part 166 is provided with the above-described structure, it is possible to alleviate or solve noise caused by the vibration.

As described above, an embodiment may alleviate or solve the problem that noise caused by vibration due to a torque of the motor 162 may be generated and spread to outside of the panel roller 160.

As illustrated in FIGS. 20 and 21, the motor 162 is accommodated in a motor housing 170 that is provided inside the panel roller 160. The motor housing 170 includes: one or more sound absorption materials 171a which is installed inside the motor housing 170 to cover the motor 162; one or more plates 171b which press the sound absorption material(s) 171a; and one or more bolts 171c which are installed outside the motor housing 170 to fix the sound absorption material(s) 171a and the plate(s) 171b to the motor shaft 162S. The bolt 166c is fitted into a hole (not shown in FIGS. 20-21) formed in the motor housing 170 and fixed so as to push the plate 171b toward the motor 162.

The sound absorption material 171a may be formed of a material including rubber, urethane, and the like, which are elastic enough to absorb vibration and not slippery. The plate 171b may be formed of a metal material and the like, which is able to press the sound absorption material 171a onto the motor 162 so that the sound absorption material 166a may be firmly attached to the motor 162 without causing deformation of the sound absorption material 171a.

The drawings show an example in which the cross-section of the motor housing 170 has a quadrangular shape because the cross-section of the motor 162 has a quadrangular shape. However, the cross-section of the motor housing 170 may have a circular shape, a polygonal shape, or any other suitable shape. In addition, the sound absorption material 171a and the plate 171b may be provided in the linear form or the circular form depending on the shape of the cross-section of the motor 162.

FIG. 20 shows an example in which the sound absorption materials 171a, the plates 171b, and the bolts 171c are installed in four surfaces of the motor 162 because the cross-section of the motor 162 has a quadrangular shape. However, the arrangement of the sound absorption materials 171a, the plates 171b, and the bolts 171c may be based on the shape of the motor 162. For example, the sound absorption materials 171a, the plates 171b, and the bolts 171c may be provided in two surfaces of the motor 162.

As described above, an embodiment of the present invention can alleviate or solve the problem that noise caused by vibration due to a torque of the motor may be generated and spread to the outside of the panel roller 160.

As described above, embodiments of the present invention can achieve a smaller and more light-weighted product such that a control board 125 for controlling a display panel 150 and a motor for rotating a roller are arranged inside a panel roller 160. In addition, embodiments of the present invention can stabilize and automate operation of a product because stopping rolling a display panel 150 up or down is directed by sensors. Furthermore, embodiments of the present invention can alleviate or solve the problem that noise caused by vibration due to a torque of the motor may be generated and spread to the outside of the panel roller 160.

What is claimed is:

1. A rollable display device comprising:
   a display panel including:
      a display area having a plurality of subpixels;
      a dummy area having a scan driver or a data driver; and
      a source board including the data driver; and
   a panel roller including:
      a control board to control the display panel;
      a motor configured to roll up the display panel around an outer circumferential surface of the panel roller;
      a roller driving unit configured to control the motor so that the display panel rolls around the outer circumferential surface of the panel roller or unrolls therefrom, wherein the roller driving unit and the motor are disposed in the panel roller, the roller driving unit including:
         a moving part configured to translate parallel to an axis of rotation of the panel roller; and
         a roller screw thread coupled to an inner circumferential surface of the panel roller, wherein the moving part is disposed inside the panel roller and engaged with the roller screw thread to translate parallel to the axis of rotation;
      wherein the control board of the panel roller is physically separated from and electrically connected to the source board of the display panel via a connector.

2. The rollable display device of claim 1, wherein the roller driving unit comprises:
   a roller rotating part configured to receive a torque from the motor and rotate the panel roller in response to the received torque;
   a first stop sensor positioned at a first location; and
   a second stop sensor positioned at a second location, the first and second stop sensors configured to sense a location of the moving part.

3. The rollable display device of claim 2,
   wherein, responsive to the moving part translating to the first location, the first stop sensor is configured to transmit a first detection signal to a motor controller to limit how much the display panel rolls around the outer circumferential surface of the panel roller, and
   wherein, responsive to the moving part translating to the second location, the second stop sensor is configured to transmit a second detection signal to the motor controller to limit how much the display panel unrolls from the outer circumferential surface of the panel roller.

4. The rollable display device of claim 2, wherein the roller rotating part comprises:
   a body coupled to an inner wall of the panel roller;
   a rotation shaft elongated from the center of the body; and
   a shaft screw thread coupled to a section of the rotation shaft,
   wherein the moving part is engaged with the shaft screw thread to translate parallel to the axis of rotation.

5. The rollable display device of claim 1, wherein the connector is a flexible cable.

6. The rollable display device of claim 1, wherein the data driver is in a form of an integrated circuit (IC) mounted on the source board.

7. The rollable display device of claim 1, wherein the plurality of subpixels includes at least a switching transistor, a drive transistor, a capacitor, a compensation circuit, and an organic light emitting diode (OLED).

8. A rollable display device comprising:
   a display panel including:
      a display area having a plurality of subpixels;
      a dummy area having a scan driver or a data driver; and
      a source board including the data driver; and
   a panel roller including:
      a control board to control the display panel;
      a motor configured to roll up the display panel around an outer circumferential surface of the panel roller;
      a roller driving unit configured to control the motor so that the display panel rolls around the outer circumferential surface of the panel roller or unrolls therefrom, wherein the roller driving unit and the motor are disposed in the panel roller, the roller driving unit including:
         a moving part configured to translate parallel to an axis of rotation of the panel roller; and
         a roller rotating part configured to receive a torque from the motor and rotate the panel roller in response to the received torque; and
      a connection part that connects a motor shaft of the motor to a rotation shaft of the roller rotating part, wherein the connection part comprises:
         a sound absorption material disposed inside the connection part to surround the motor shaft;
         a plate pressing the sound absorption material; and
         a bolt disposed outside the connection part to fix the sound absorption material and the plate to the motor shaft;
      wherein the control board of the panel roller is physically separated from and electrically connected to the source board of the display panel via a connector.

9. The rollable display device of claim 8, wherein the roller driving unit further comprises:
a first stop sensor positioned at a first location; and
a second stop sensor positioned at a second location, the first and second stop sensors configured to sense a location of the moving part.

10. A rollable display device comprising:
a display panel including:
a display area having a plurality of subpixels;
a dummy area having a scan driver or a data driver; and
a source board including the data driver; and
a panel roller including:
a control board to control the display panel;
a motor configured to roll up the display panel around an outer circumferential surface of the panel roller;
a roller driving unit configured to control the motor so that the display panel rolls around the outer circumferential surface of the panel roller or unrolls therefrom, wherein the roller driving unit and the motor are disposed in the panel roller, the roller driving unit including:
a moving part configured to translate parallel to an axis of rotation of the panel roller; and
a motor housing that accommodates the motor in an inner space of the panel roller, wherein the motor housing comprises:
a sound absorption material disposed inside the motor housing to surround the motor;
a plate pressing the sound absorption material; and
a bolt disposed outside the motor housing to fix the sound absorption material and the plate to the motor;
wherein the control board of the panel roller is physically separated from and electrically connected to the source board of the display panel via a connector.

11. The rollable display device of claim 10, wherein the roller driving unit further comprises:
a roller rotating part configured to receive a torque from the motor and rotate the panel roller in response to the received torque;
a first stop sensor positioned at a first location; and
a second stop sensor positioned at a second location, the first and second stop sensors configured to sense a location of the moving part.

* * * * *